United States Patent [19]

Fulton

[11] 4,096,508
[45] Jun. 20, 1978

[54] MULTIPLE JUNCTION SUPERCURRENT MEMORY DEVICE UTILIZING FLUX VORTICES

[75] Inventor: Theodore Alan Fulton, Warren Township, Somerset County, N.J.

[73] Assignee: Bell Telephone Laboratories, Incorporated, Murray Hill, N.J.

[21] Appl. No.: 631,922

[22] Filed: Nov. 14, 1975

[51] Int. Cl.² ............................................. H01L 39/22
[52] U.S. Cl. .................................. 357/5; 307/277; 307/306
[58] Field of Search ..................... 357/5; 307/277, 306

[56] References Cited

U.S. PATENT DOCUMENTS

| 3,480,925 | 11/1969 | Michaelis | 340/174 |
| 3,676,718 | 7/1972 | Anderson et al. | 307/306 |
| 3,936,677 | 2/1976 | Fulton et al. | 307/306 |
| 3,936,809 | 2/1976 | Zappe | 307/306 |

OTHER PUBLICATIONS

T. A. Fulton et al, "The Flux Shuttle...", Proceedings of the IEEE, vol. 61, No. 1, Jan. 1973, pp. 28–35.

Primary Examiner—William D. Larkins
Attorney, Agent, or Firm—Michael J. Urbano

[57] ABSTRACT

A supercurrent memory device comprises a plurality of extended Josephson junctions coupled to one another by having their weak-link layers in contact. Vortices corresponding to one logic state are generated in one pair of junctions, whereas vortices corresponding to a different logic state are generated in another pair of junctions in such a manner that the pairs have at least one junction in common and one junction not in common. Also described are various vortex sensors which may be used in conjunction with the memory device or other extended supercurrent devices.

6 Claims, 16 Drawing Figures

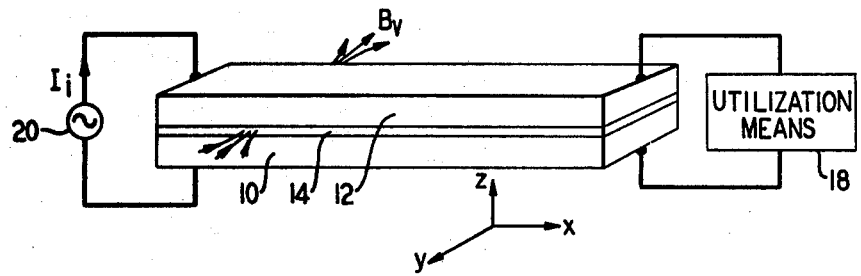
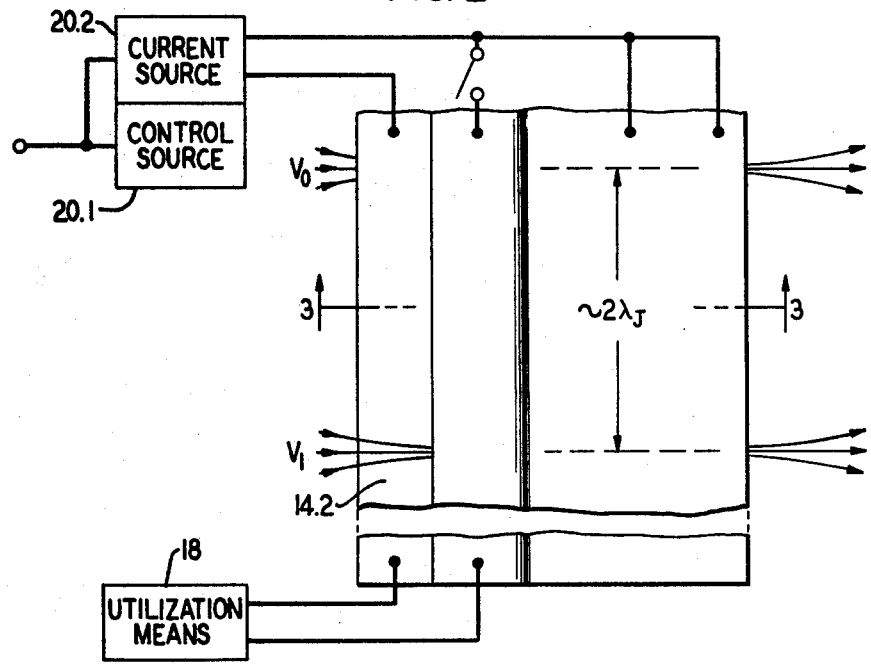
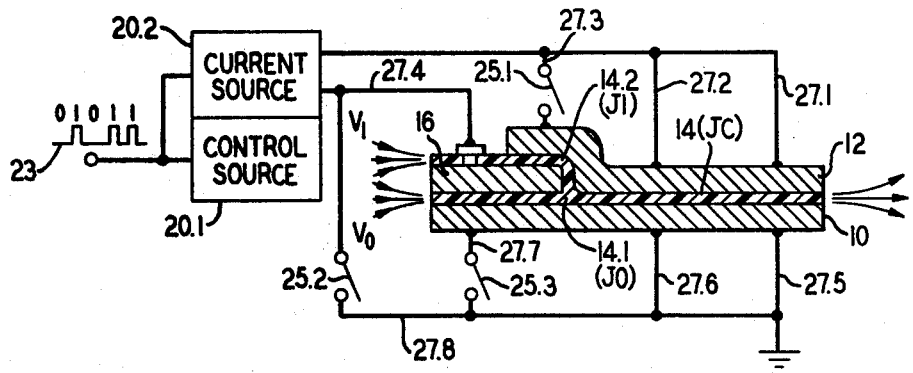

MULTIPLE JUNCTION SUPERCURRENT MEMORY DEVICE UTILIZING FLUX VORTICES

BACKGROUND OF THE INVENTION

This invention relates to elongated weak-link supercurrent devices and, more particularly, to controlling the propagation of mobile flux vortices in such devices.

In U.S. Pat. No. 3,676,718 granted to P. W. Anderson, R. C. Dynes and T. A. Fulton on July 11, 1972, there are described a variety of weak-link supercurrent devices (e.g., shift registers, memories) which are capable of sustaining one or more trapped magnetic field (flux) vortices which correspond to information bits. In an extended Josephson junction (SIS) device, that is, one which is long in one direction compared to the Josephson penetration depth $\lambda_J$, the patent teaches that a vortex is induced by a spatial variation of the supercurrent J in which a positive supercurrent flows through the I-layer and into the contiguous superconductor to a depth of about $\lambda_L$, the London penetration depth, then along the superconductor a distance of about $2\lambda_J$, thence through the I-layer again as a negative supercurrent into the opposite superconductor to a depth of about $\lambda_L$ and finally back to the point of beginning. Such a vortex supports a net magnetic flux of approximately $\phi_o = 2.07 \times 10^{-15}$ Wb, the well-known flux quantum. As defined in the patent, the term vortex means an entity which includes both the circulating supercurrent J and the flux quantum $\phi_o$ induced thereby.

Once created, the patent states, a vortex prefers to position and distribute itself in a region so that a local minimum of the sum of the magnetic energy plus the Josephson coupling energy is established. These local minima can be thought of as magnetic potential wells in which vortices can be stored. Where a plurality of such potential wells are present in a single weak-link structure, it is possible to move the vortex from one such well to another by applying a force thereto as, for example, by applying a local current or magnetic field to a region near to the vortex. In such an arrangement, the presence of a vortex in a potential well may be viewed as a logical one in binary notation whereas the absence of a vortex would be a logical zero.

In contrast, if the structure in which the vortex is created has no local minima of energy over an extended length in the direction of propagation, then once set in motion the vortex will propagate at a velocity, and to a distance, determined by damping processes (e.g., single particle tunneling). This kind of structure could function as a transmission line on which information is carried in the form of a train of sequential vortices. As long as there are no voids (absent vortices) in the vortex train, the mutual magnetic repulsion maintains the vortex ordering. If, however, the train is encoded by eliminating some vortices to represent logical zero, then vortices near the void would tend to drift and the ordering of the vortices would be lost. To maintain ordering one solution suggested by the prior art is to construct the transmission line with periodically spaced potential wells which serve as memory locations for the vortices.

SUMMARY OF THE INVENTION

The need for potential wells to insure ordering is eliminated in an illustrative embodiment of the invention in which the absence of a vortex is not used to represent a logic state. Instead, a train of vortices, with no voids, is encoded by a device which comprises a plurality of extended Josephson junctions coupled to one another by having their weak-link layers in contact. Vortices representing one logic state are generated in, or coupled into, one pair of junctions whereas vortices corresponding to a different logic state are generated in, or coupled into, another pair of junctions in such a manner that the pairs have at least one junction in common and one junction not in common. The ordering of vortices is maintained by their mutual repulsion in the common junction which also allows the vortices to be shifted by applying a force (electric current or magnetic field) preferably to the common junction.

In one illustrative embodiment suitable for binary encoding, a supercurrent transmission line, including the usual pair of superconductive layers and weak-link layer therebetween, is characterized in that a third superconductive layer is disposed between the pair, and the weaklink layer is bifurcated into first and second portions which extend on opposite sides of the third layer; that is, the weak-link layer extends between the first and third layers and between the second and third layers. Thus, three junctions are formed: a common junction between the first and second superconductive layers and a pair of stacked junctions, one between the first and third superconductive layers and the other between the second and third superconductive layers. Coupling vortices into selected ones of the stacked junctions enables binary encoding and simultaneously coupling all vortices into the common junction preserves vortex ordering and enables the vortices to be shifted by applying a current or magnetic field to the common junction.

At some point along the transmission line, typically the output end, the vortices can be detected by means of a sensor which preferably produces a large signal (usually a voltage) for a relatively long time. Typically sensing would occur after a chain of logic operations for communicating from one chip to another or to the outside world. Described hereinafter are three types of sensors (themselves supercurrent junctions) which overlap the junction in which vortices are to be detected. In one case, the sensor detects directly the vortex magnetic field. In another, the critical current of the sensor junction is altered by a vortex-induced phase gradient along a superconductor of the transmission line. In the third, the critical current of the sensor junction is altered by a phase difference across the superconductors of the line.

BRIEF DESCRIPTION OF THE DRAWING

These and other objects of the invention, together with its various features and advantages, can be easily understood from the following more detailed description taken in conjunction with the accompanying drawing, in which:

FIG. 1 is a pictorial view of an extended Josephson junction transmission line typical of the prior art;

FIG. 2 is a top view of a supercurrent memory device for binary encoding in accordance with one embodiment of the invention;

FIG. 3 is a cross-section taken along line 3—3 of FIG. 2;

DETAILED DESCRIPTION

Figure 4:
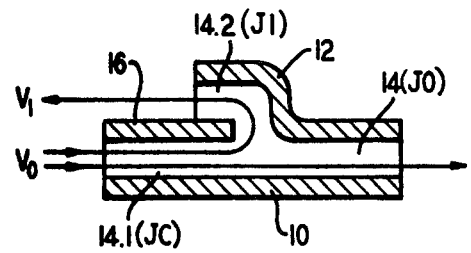
FIG. 4 is analagous to FIG. 3 and demonstrates that any of the three junctions can be chosen as the common junction.

In each of the embodiments described below it is to be understood that cryogenic means, not shown but well known in the art, is generally provided in order to induce superconductivity in the superconductive layers of the devices. In the figures substantially identical components are given the same reference numeral to facilitate comparison.

Before discussing in detail the various embodiments of our invention, it will be helpful to consider first the motion of a flux vortex as it propagates along an extended supercurrent device of the type shown in FIG. 1. The device is a sandwich structure including a pair of superconductive layers or electrodes 10 and 12 separated by a weak-link layer 14 sufficiently thin to permit two-particle tunneling therethrough. Layer 14 is typically an insulator, thus forming an SIS structure of the type described by J. M. Rowell in U.S. Pat. No. 3,281,609 (e.g., Pb-PbO-Pb). However, the device of FIG. 1 is an extended structure; that is, its length in the direction of vortex propagation (x-direction) is much greater than the Josephson penetration depth $\lambda_J$. A weak-link SIS device is commonly known as a Josephson junction device. In this context the term junction may be thought of as including the portion of the weak-link layer common to both superconductive electrodes and at least the contiguous portions of both electrodes in which the vortex supercurrent flows.

Vortices are generated at one end of the device by means of a current source 20 in the manner described in the aforementioned U.S. Pat. No. 3,676,718. That is, the input current $I_i$ from source 20 is maintained below the critical supercurrent $I_c$ of the weak-link structure so that during operation the structure is at all times in a supercurrent state. However, the input source 20 may be encoded to produce a train of input current pulses $I_i$ each of which in turn generates a separate vortex. Each vortex, which propagates in the x-direction with a velocity and to a distance determined by damping processes, is characterized by a circulating supercurrent (not shown) and a magnetic field $B_v$ induced thereby. The magnetic field has associated with it a well-known flux quantum $\phi_o$.

At the other end the device vortices are coupled to utilization means 18 connected across superconductive electrodes 10 and 12. Illustratively, utilization means 18 comprises a supercurrent magnetometer of the quantum interference type described in U.S. Pat. No. 3,676,718 (FIG. 10A), also known by the acronym SQUID, Superconducting QUantum Interference Device. When using a SQUID actual electrical connection to electrodes 10 and 12 is not made because only the magnetic field of the vortex is sensed. Other types of sensors which function as utilization means are described hereinafter with reference to FIGS. 11–14.

Turning now to FIGS. 2 and 3, there is shown a shift register or memory device in accordance with an illustrative embodiment of the invention. A supercurrent transmission line is formed by a pair of superconductive layers 10 and 12 and weak-link layer 14 therebetween. Thus, the supercurrent transmission line of FIG. 1 corresponds to the right-hand portion of the device shown in FIG. 3. This embodiment of the invention, however, is characterized in that a third superconductive layer 16 is interposed between the superconductive layers 10 and 12 along the length of the device. As shown in FIG. 3, the third superconductive layer 16 laterally extends only partway between superconductive layers 10 and 12. In addition, this embodiment of the invention is further characterized in that the weak-link layer 14 is bifurcated into first and second portions 14.1 and 14.2 which extend on opposite sides of the third superconductive layer 16. In practice, of course, portions 14.1 and 14.2 would typically be formed in separate processing (e.g., oxidation) steps.

Three Josephson junctions are thereby formed along substantially the entire length of the device: a common junction JC formed by superconductive layers 10 and 12 and weak-link layer 14 on the right-hand side of the device; and a pair of stacked Josephson junctions, one (J1) formed by superconductive layers 12 and 16 and weaklink layer portion 14.2, and the other (JO) formed by superconductive layers 10 and 16 and weak-link layer portion 14.1.

Binary encoded information (e.g., PCM frame 23) is written into the device through the combination of control source 20.1, current source 20.2 and switches 25.1, 25.2 and 25.3 under the control of source 20.2. Current source 20.2 is connected to superconductive layer 12 at, for example, three points via conductors 27.1, 27.2 and 27.3, the latter being interrupted by switch 25.1. Inasmuch as extended Josephson junctions are distributed current devices, these conductors are only illustrative of the many ways in which current can be applied. Current source 20.2 is also connected to superconductive layer 16 via conductor 27.4. Return paths are provided by conductors 27.5, 27.6 and 27.7 connected to superconductive layer 10, and by conductor 27.8 connected to superconductive layer 16 (via conductor 27.4). Conductors 27.7 and 27.8 are interrupted by switches 25.3 and 25.2, respectively. The connections are made so that current carried by conductors 27.1, 27.2, 27.5 and 27.6 drive the common junction JC. When suitably switched, current carried by conductors 27.3 and 27.4 drives the junction J1 and current carried by conductors 27.4 and 27.7 drives the junction JO.

In operation, when a logical zero such as the first position of PCM frame 23, is to be written into the device, control source 20.1 (by means well known, but not shown) opens switch 25.1 and 25.2 and closes switch 25.3. A current pulse from current source 20.2 excites junction JO and JC, but not J1. In this state, vortex $V_o$ threads through weak-link layers 14.1 and 14. When a logical one, such as the second position of PCM frame 23, is to be written into the device, control source 20.1 closes switches 25.1 and 25.2 and opens switch 25.3. Then, a current pulse from current source 20.2 excites junctions J1 and JC, but not JO. In this state a vortex $V_1$ threads through weaklink layers 14.2 and 14.

It is clear, therefore, that the physical design of the structure defines the logic state of a particular vortex. Because all of the vortices, regardless of their logic state, share the common junction JC, the ordering of the vortices is maintained by their mutual magnetic repulsion in the common junction. This feature also enables the vortices to be shifted along the transmission line by applying a suitable current or magnetic field preferably to the common junction. Such a force could simply be the current pulses supplied by current source 20.2.

In FIG. 3 the junction including weak-link layer 14 functioned as the common junction JC by virtue of the manner in which sources 20.1 and 20.2 were connected to the device. Which of three junctions is chosen to be the common junction is somewhat arbitrary, however, and is dependent only on how the connections are made. Thus, in FIG. 4, a logical one is represented by a vortex $V_1$ which threads weak-link layers 14.1 and 14.2 (junctions J1 and JC) whereas a logical zero is represented by a vortex $V_o$ which threads layers 14.1 and 14 (junctions JO and JC). Thus, the common junction JC is defined by layer 14.1.

Figure 5:
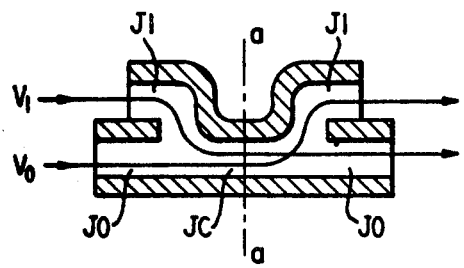
FIGS. 5 and 6 are cross-sections of embodiments of the invention having miror symmetry about lines a—a and b—b, respectively, each half corresponding to a device of the type shown in FIG. 3.
Figure 6:
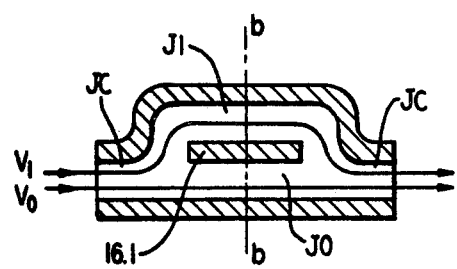

Other geometric configurations for binary encoding are also possible. For example, in FIG. 5 the common junction is in the center and pairs of junctions J1 and JO are formed on each side so that the device exhibits symmetry about line a—a, each half being substantially identical to FIG. 3. Similarly, in FIG. 6 the junctions J1 and JO are formed in the center and a common junction is formed on each side. This device also exhibits symmetry. About line b—b each half is substantially identical to FIG. 3. Of course, in FIG. 6 at least one end of buried superconductor 16.1 would be exposed for the purpose of making electrical contact thereto.

Figure 7:
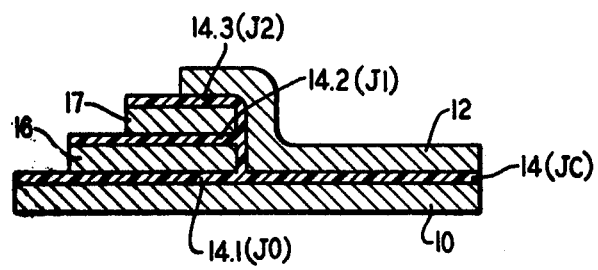
FIG. 7 is a cross-section of a supercurrent memory device for tertiary encoding in accordance with another embodiment of the invention.

Although FIGS. 2–6 depict devices suitable for binary encoding, higher order ($n^{th}$ order) logic systems are feasible by providing $n$ separate junctions into which the vortices can be coupled. Only a single common junction is required, however. Thus, as shown in FIG. 7 a common junction JC is formed by superconductive layers 10 and 12 and weak-link layer 14 therebetween on the right-hand side of the device. On the left-hand side a pair of superconductive layers 16 and 17 are interposed between layers 10 and 12. Weak-link layer 14 is bifurcated for tertiary encoding ($n = 3$) into three portions 14.1, 14.2, and 14.3 which separate each of the superconductive layers from one another and form three stacked junctions JO, J1 and J2. Operation of the device of FIG. 4 is similar to that of FIGS. 2 and 3, and in the interests of simplicity will not be repeated.

Figure 8A:
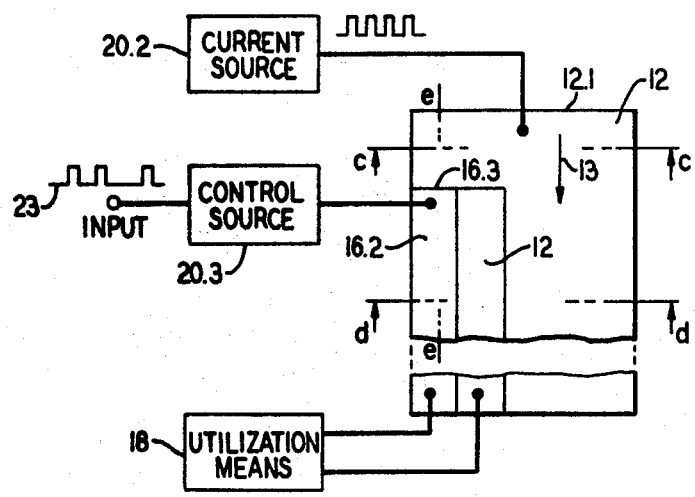
FIG. 8A is a top view of an embodiment of the invention demonstrating an alternate scheme for coupling vortices into the various junctions.
Figure 8B:
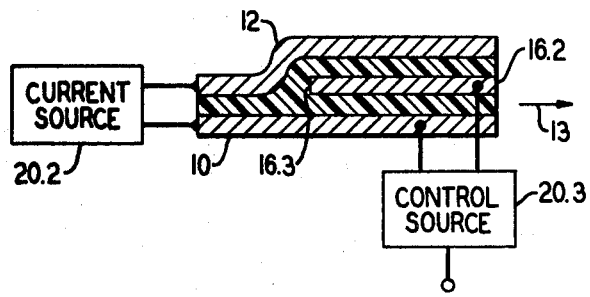
FIG. 8B is a cross-section taken along line e—e of FIG. 8A.

An alternative way of writing information in the device of FIG. 3 is implemented in the embodiment of FIG. 8A, a top view in which a section along line c—c is a transmission line of the type depicted in FIG. 1 and a section along line d—d is a device of the type depicted in FIG. 3. A feature of this embodiment is that superconductive layer 16.2 is not lengthwise coextensive with the remainder of the device. Rather as shown in FIG. 8B, a cross-section along line e—e of FIG. 8A, layer 16.2 starts at some point 16.3 down the transmission line away from the end 12.1 at which vortices are generated by current source 20.2. The weak-link layers of all junctions are in contact as shown in FIG. 8B.

In operation, current source 20.2, connected across layers 10 and 12, creates a train of uniformly spaced vortices which propagate in the direction of arrow 13 toward the end 16.3 of layer 16.2. A PCM frame 23 to be written into the device is applied to control source 20.3 which is connected to the lower stacked junction, i.e., to superconductive layers 10 and 16.2. The output of control source 20.3 is a train of current pulses having a one-to-one correspondence to frame 23 but with a d.c. bias level subtracted. In the absence of a pulse in frame 23 (logical zero) the d.c. level is sufficient to attract a vortex into the lower of the stacked junctions (and the common junction). On the other hand, the presence of a pulse in frame 23 (logical one) causes a current pulse to be subtracted from the d.c. bias, so that a vortex is no longer attracted into the lower junction. Instead, the vortex is coupled into the upper stacked junction (and the common junction). Of course, the roles of the junctions can be interchanged as discussed with reference to FIG. 4.

Figure 9:
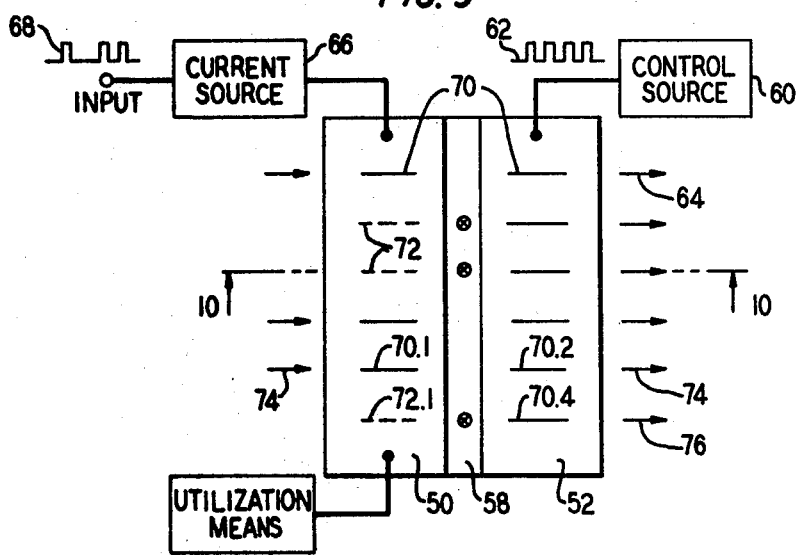
FIG. 9 is a top view of another embodiment of the invention using only a single pair of junctions for binary encoding.
Figure 10A:
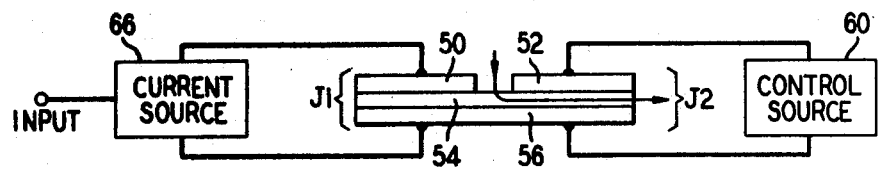
FIG. 10A is a cross-section taken along line 10—10 of FIG. 9.
Figure 10B:
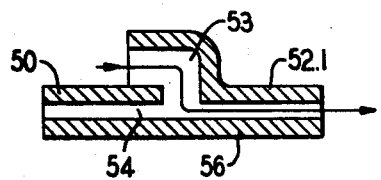
FIG. 10B is a cross-section similar to FIG. 10A with a magnetic coupler included to enhance coupling across channel 58.

Another embodiment of the invention utilizing only a single pair of junctions is shown in FIGS. 9 and 10A. A pair of laterally spaced, extended junctions J1 and J2 are formed by a pair of elongated, spaced superconductors 50 and 52 on a common weak-link layer 54 and underlying superconductor 56. A channel 58 is thus formed between superconductors 50 and 52. A control source 60 applies a train of uniformly spaced current pulses 62 across junction J2 to generate therein uniformly spaced vortices 64. Current source 66, on the other hand, drives junction J1 in response to information in the form, for example, of PCM signal 68. Thus, in FIG. 9 the solid, horizontal lines 70 on layers 50 and 52 represent the presence of vortices in weak-link layer 54 (in both junctions J1 and J2) whereas the dashed lines 72 represent the absence of vortices (in junction J1 only). By electronic circuitry well known in the art, the pulses applied by sources 60 and 66 are synchronized. The periodic vortices in junction J2 serve only to define memory locations for vortices coupled into junction J1. That is, a portion of the magnetic field of the vortices in J2 is coupled into J1 and by magnetic attraction to the vortices in J1 determines their memory locations. This attraction is enhanced by making the width of channel 58 small relative to its height. Alternatively, the coupling can be enhanced as shown in FIG. 10B by filling the channel with a thick insulator 53 (so no junction is formed) and making superconductive layer 52.1 to overlap insulator 53. In this case the width of the channel is preferably made small relative to the length of insulator 53. Of course, instead of making layer 52.1 overlap insulator 53, a separate superconductive layer may be made to overlap the channel and insulator.

Thus, lines 70.1 and 70.2 represent a single vortex created by vortices simultaneously generated at the input end of the device. This single vortex extends across the entire width of weak-link layer 54 as depicted by arrows 74. In contrast, dashed line 72.1 means that no vortex was created in junction J1 at the time that the vortex corresponding to line 70.4 was generated in J2. In this case, the vortex 76 extends only in the weak-link portion of junction J2 and exits through the channel 58 as shown in FIG. 10A. It is apparent, therefore, that in both logic states vortices occupy a common junction (J2). In one logic state the vortices occupy junctions J1 and J2 and in the other state they occupy junction J2 and channel 58.

In the foregoing embodiments, at some point along the transmission line (typically the output end) the vortices are detected by means of a sensor which preferably produces a large signal (usually a voltage) for relatively a long time (e.g., 1 mV for 1 nsec). Typically, sensing occurs after a chain of logic operations for communicating from one chip to another or to the outside world.

Figure 11:
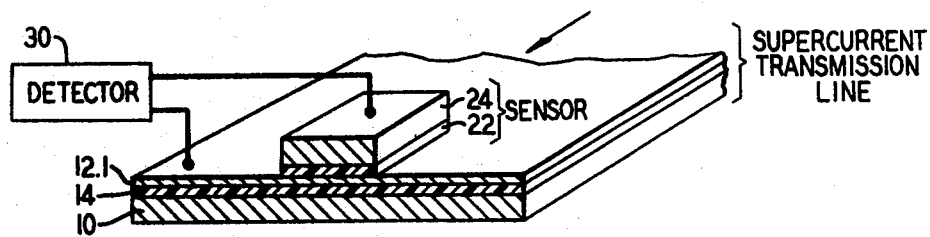
FIG. 11 is a pictorial view, partially in crosssection, of a sensor arrangement for detecting vortices based on a change in phase-gradient.

FIG. 11, for example, depicts a phase gradient sensor. Superconductive layers 10 and 12.1 and weak-link layer 14 form an extended supercurrent transmission line junction which carries propagating vortices to be detected. Layer 12.1 is made to be thin comparable to a few $\lambda_L$, the London penetration depth which is about 500 to 1,000 A. A sensor junction is formed on superconductive layer 12.1 by means of a second weak-link layer 22 and superconductive layer 24. A detector 30, typically a voltmeter, is connected between superconductive layers 12.1 and 24. The critical current of the sensor junction is altered by the presence of a vortex propagating thereunder in the transmission line. The critical current is changed primarily by the phase gradient induced on the outer surface of the thin superconductive layer 12.1, and not directly by the vortex magnetic field. Preferably superconductive layer 24 does not overlap superconductive layer 10. If it does, however, the critical current density of the junction which would be formed between layers 10 and 24 should be kept much lower than that of the transmission line junction.

Figure 12:
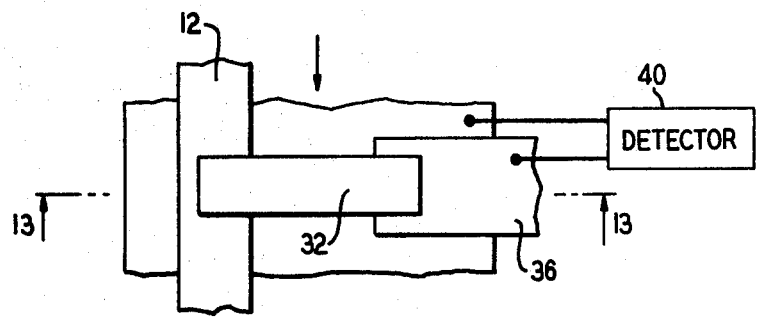
FIG. 12 is a top view of another sensor arrangement for detecting directly the magnetic field of a vortex.
Figure 13:
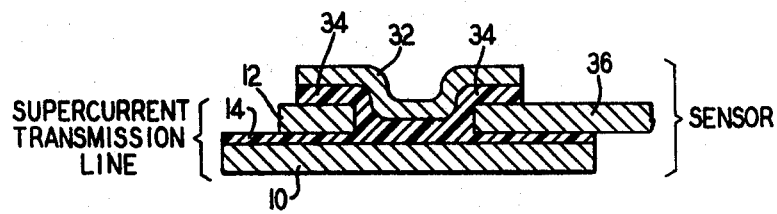
FIG. 13 is a cross-section taken along line 13—13 of FIG. 12.

An alternative way of detecting the presence of vortices in a supercurrent transmission line is to detect directly the vortex magnetic field. This field is quite small for through-the-air coupling unless the sensor junction and the transmission-line junction are spaced less than about one micrometer apart. This problem can be alleviated, however, by utilizing a coupler in the form of an overlying superconductive layer 32 as shown in FIGS. 12 and 13. The supercurrent transmission line is formed by superconductive layers 10 and 12 and weak-link layer 14. The sensor junction is formed by superconductive layers 10 and 36 and weak-link layer 14. Thus, the transmission line junction and sensor junction are laterally separated from one another by a gap. In order to increase the magnetic coupling between the transmission line junction and the sensor junction, a superconductive layer 32 is made to overlay superconductive layers 12 and 36. Layer 32 is insulated from both junctions by means of insulative layer 34 so that the critical current density between layers 32 and 10 is much less than that of the transmission line junction.

Figure 14:
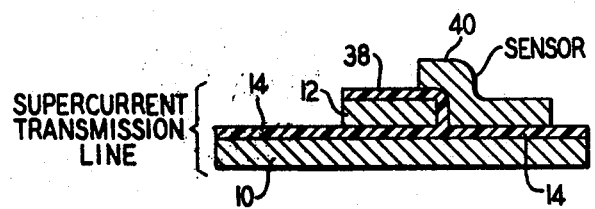
FIG. 14 is a cross-section of yet another sensor arrangement for detecting the vortex-induced phase difference across a pair of superconductors in a transmission line.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the sensor junction may actually overlap the transmission line junction as shown in FIG. 14. The transmission line junction is formed by superconductive layers 10 and 12 and weak-link layer 14 therebetween. The sensor junction is formed by superconductive layers 10 and 40 and weak-link layer 14 therebetween. Superconductive layer 12 is separated from layer 40 by insulative layer 38 which is thick enough to make the critical current density between layers 12 and 40 much less than that of the transmission line junction. If, however, layer 38 is thin enough to form a supercurrent junction, then the sensor detects primarily the phase difference between superconductive layers 10 and 12, rather than the vortex magnetic field directly. In practice such a phase-difference sensor has exhibited about a 70 percent change in critical current in response to a vortex. In contrast, a phase gradient sensor of the type shown in FIG. 11 exhibited only a 1 percent change. Similarly, the calculated critical current change for the magnetic field sensor of FIGS. 12-13 is about 5 percent. For this reason the phase-difference sensor is preferred.

Moreover, in order to enhance signal levels, several quanta of adjacent flux may be utilized to represent each logic state. Of course such an arrangement results in reduced information storing capacity.

What is claimed is:

1. A supercurrent device comprising a plurality of extended Josephson junctions stacked on top of one another and capable of supporting the propagation of mobile flux vortices, each of said junctions having a pair of superconductive layers and a weak-link layer separating said pair, a common extended Josephson junction having a weak-link layer in contact with each of the weak-link layers of said stacked junctions so that vortices corresponding to one logic state occupy one of said stacked junctions and said common junction and vortices corresponding to a different logic state occupy another of said stacked junctions and said common junction, the mutual magnetic repulsion of vortices in said common junction being effective to maintain their ordering.

2. The device of claim 1 including
   a supercurrent transmission line having a weak-link layer connected to the weak-link layers of said device so that vortices in said line can be coupled into the junctions of said device,
   means for generating a train of vortices in said line propagating toward said device,
   means for applying to at least one of said stacked junctions a control signal effective to cause vortices in said line to be coupled into said common junction and into selected ones of said stacked junctions in accordance with information to be stored.

3. A superconductive device comprising
   a supercurrent transmission line which includes a pair of superconductive layers and a weak-link layer separating said superconductive layers and contiguous therewith,
   said line being adapted to support the propagation of mobile flux vortices therein and having a length, as measured in the direction of propagation, which is much greater than the Josephson penetration depth at the operating temperature of said device,
   CHARACTERIZED IN THAT said line includes a third superconductive layer interposed partway between said pair of superconductive layers, and said weak-link layer has first and second extended portions separated from one another by said third superconductive layer and a third extended portion coupled to said first and second portions, so that vortices corresponding to one logic state occupy said first and third portions and those corresponding to another logic state occupy said second and third portions.

4. A superconductive device comprising a supercurrent transmission line which includes a pair of superconductive layers and a weaklink layer separating said superconductive layers and contiguous therewith, said line being adapted to support the propagation of mobile flux vortices wherein and having a length, as measured in the direction of propagation, which is much greater than the Josephson penetration depth at the operating temperature of said device, means for maintaining said device at a fixed cryogenic operating temperature, and means for detecting the presence of said vortices in said transmission line, CHARACTERIZED IN THAT one of said pair of superconductive layers is made to be thin relative to a few $\lambda_L$, the London penetration depth at said operating temperature of said device, said detecting means includes a supercurrent sensor junction comprising a second weak-link layer formed on said one superconductive layer and a third superconductive layer formed on said second weaklink layer, and means are connected between said one superconductive layer and said third superconductive layer for detecting changes in the critical current of said sensor junction.

5. A superconductive device comprising a supercurrent transmission line which includes a pair of superconductive layers and a weak-link layer separating said superconductive layers and contiguous therewith, said line being adapted to support the propagation of mobile flux vortices therein and having a length, as measured in the direction of propagation, which is much greater than the Josephson penetration depth at the operating temperature of said device, and means for detecting the presence of said vortices in said transmission line, CHARACTERIZED IN THAT said detecting means includes a third superconductive layer which overlays at least an edge of one of the superconductive layers of said pair, means insulates said one superconductive layer from said third superconductive layer, and said third superconductive layer contacts a portion of said weak-link layer thereby forming a supercurrent sensor junction with the other superconductive layer of said pair.

6. The device of claim 5 wherein said means which insulates comprises an insulative layer sufficiently thin to also form a supercurrent sensor junction between said third layer and said one layer.

* * * * *